United States Patent [19]

Sanwo et al.

[11] Patent Number: 4,704,549
[45] Date of Patent: Nov. 3, 1987

[54] CMOS TO ECL CONVERTER-BUFFER

[75] Inventors: Ikuo J. Sanwo, San Marcos; Donald K. Lauffer, Poway; Donald G. Tipon, San Diego, all of Calif.

[73] Assignee: NCR Corporation, Dayton, Ohio

[21] Appl. No.: 922,915

[22] Filed: Oct. 24, 1986

[51] Int. Cl.$^4$ .................. H03K 19/092; H03K 19/20; H03K 19/017; H03L 5/00

[52] U.S. Cl. .................................. 307/475; 307/445; 307/448; 307/451; 307/264; 307/571; 307/576

[58] Field of Search ............... 307/264, 571, 576, 443, 307/445, 448, 451, 475, 200 B

[56] References Cited

U.S. PATENT DOCUMENTS 4,563,601  1/1980  Asano et al. .................... 307/475

FOREIGN PATENT DOCUMENTS 2740799  3/1979  Fed. Rep. of Germany ...... 307/475

Primary Examiner—Stanley D. Miller
Assistant Examiner—M. R. Wambach
Attorney, Agent, or Firm—Wilbert Hawk, Jr.; Edward Dugas

[57] ABSTRACT

The circuit of the present invention converts CMOS logic level signals to corresponding ECL logic level signals to permit the coupling of CMOS and ECL devices. In addition, the present invention maintains a relatively constant impedance as the logic levels on its output change. The circuit has an input terminal connectable to a source of a first set of logic signals and an output terminal connectable to a device that is responsive to a second set of logic level signals. First and second power terminals are provided for connection to first and second power supplies, respectively. A transistor of first conductivity type having first, second and gate terminals is provided with the gate terminal connected to the input terminal and the first terminal connected to the first power supply terminal. A second transistor of opposite conductivity type having a first, second and gate terminal is provided with the gate terminal of the second transistor connected to the second terminal of the first transistor. The second terminal of the second transistor is connected to the output terminal and the first terminal of the second transistor is connected to the second power supply terminal. A saturation means is connected between the gate terminal and the second terminal of the second transistor. The saturation means is responsive to the signal on the input terminal for saturating the second transistor in an "ON" state when the logic level 0 is applied to the input terminal.

3 Claims, 1 Drawing Figure

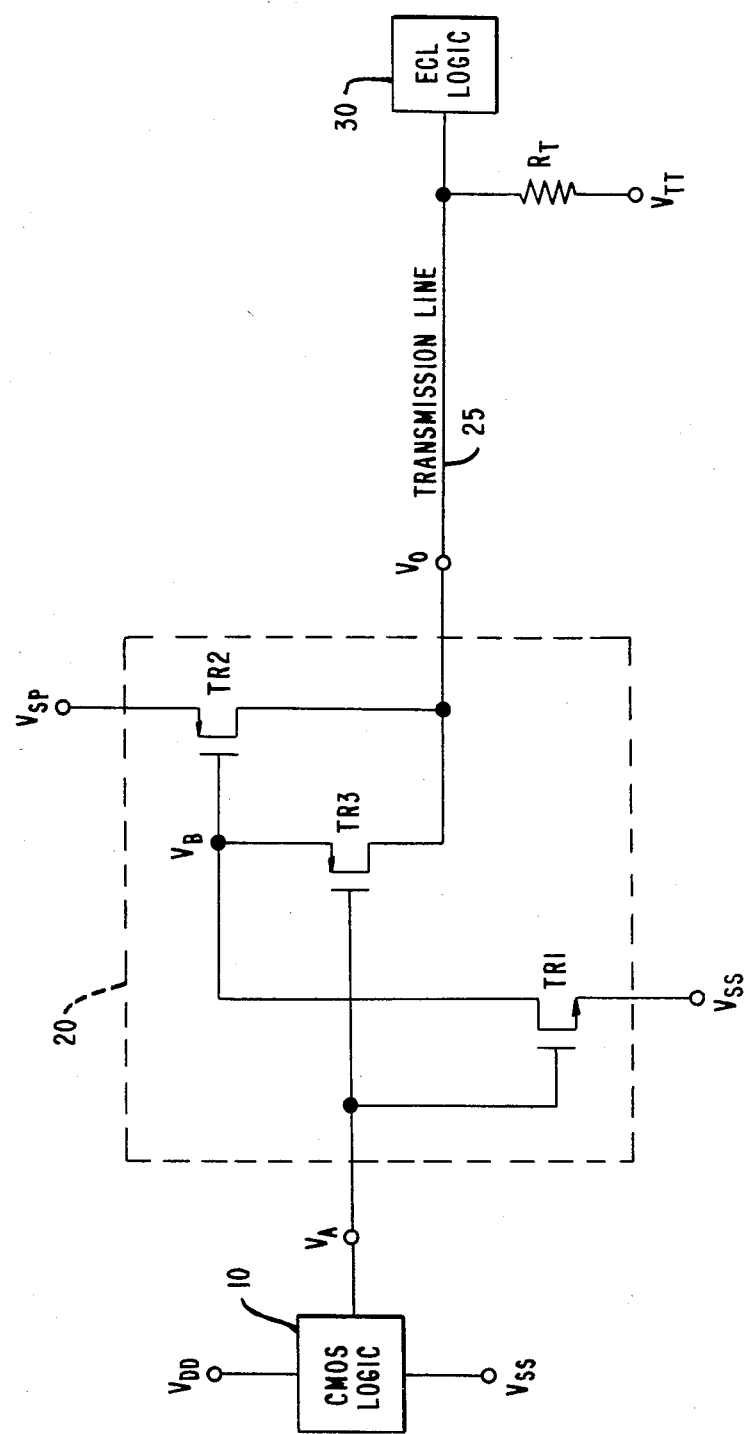

CMOS TO ECL CONVERTER-BUFFER

BACKGROUND OF THE INVENTION

The subject matter of the present invention relates generally to circuitry for converting CMOS logic levels to corresponding ECL logic levels to permit the coupling of CMOS circuits to ECL circuits and to logic circuit buffer drivers, of the type that are used in networks where matched impedance terminated transmission line communication is required.

To couple a CMOS circuit to an ECL circuit, the difference between the output voltages from the one circuit and the input voltages needed by the second circuit must be generated by some form of interfacing circuit. A CMOS circuits' logic level "1" will approach the power supply value which is generally three to five volts, while its logic level "0" will be near the reference or ground level. On the other hand, an ECL circuits' logic level "1" will approach −0.8 volts while its logic level "0" will approach −1.68 volts.

Circuitry for performing an interface function should contain only a few transistors in order to minimize the use of silicon area and to minimize propagation delays through the transistors. The interfacing circuitry additionally should maintain a relatively constant low output impedance during the transition.

A patent of interest is U.S. Pat. No. 4,453,095, entitled "ECL MOS Buffer Circuits" by R.S. Wrathall. The circuit described in that patent is an input buffer for receiving on its input ECL logic signals and for providing at its output CMOS signals.

Another patent of interest is U.S. Pat. No. 4,538,076, entitled "Level Converter Circuit", by H. Shimada. The circuit of that patent is a level converter for converting a first logic signal, using a lower voltage supply as a base potential, into a second logic signal having a higher voltage supply as a base potential.

Another patent of interest is U.S. Pat. No. 4,563,595, entitled "CMOS Schmitt Trigger Circuit for TTL Logic Levels", by B.K. Bose. The circuit of that patent is a TTL to CMOS translator using the hysteresis normally found in Schmitt triggers.

Another patent of interest is U.S. Pat. No. 4,563,601, entitled "Level Conversion Input Circuit", by N.A. Kokubunji et al. The circuit of that patent converts an ECL level to a CMOS level. The circuit is adapted to provide a level conversion input circuit which has high speed performance and low power consumption while being relatively stable as to the fluctuation of temperature and power source voltages.

SUMMARY OF THE INVENTION

The circuit of the present invention performs level conversion from CMOS logic levels (0 and −3.3 volts) to ECL logic levels (−0.8 and −1.6 volts) and maintains a relatively constant low output impedance during the transition. The circuit eliminates the need for a pulldown transistor to establish the lower logic level because it self clamps at approximately one threshold drop. The elimination of the need for a pulldown transistor reduces the chip power dissipation and the chip device area required. The foregoing also eliminates the need for a lower logic level power supply which significantly simplifies the chip layout. Advantages to the configuration are the elimination of the pulldown transistor while permitting the device to be wire-OR'd with other similar circuits or ECL devices. The constant impedance characteristic provides signals which are clean and eliminates the need for external clamps generally used to improve signal fidelity.

In the preferred embodiment of the invention there is provided an input terminal connectable to a source of CMOS logic signals. An output terminal is provided for connection to a device that is responsive to ECL level signals. First and second power terminals are provided for connection to −3.3 and −0.8 volt supplies, respectively. A transistor of first conductivity type having first, second and gate terminals has its gate terminal connected to the input terminal and its first terminal connected to the first power terminal. A second transistor of opposite conductivity type having first, second and gate terminals has its gate terminal connected to the second terminal of the first transistor and its second terminal connected to the output terminal. The first terminal of the second transistor is connected to the second supply terminal and a saturation device is connected between the gate terminal and the second terminal of the second transistor with the saturation device being responsive to a logic "0" signal on the input terminal for saturating the second transistor in an "ON" state.

From the foregoing it can be seen that is a principal object of the present invention to provide an improved CMOS to ECL interface circuit.

It is another object of the present invention to provide a converter-buffer circuit which provides a low constant output drive impedance to maintain good signal fidelity.

It is yet another object of the present invention to provide a circuit which eliminates the need for a pulldown transistor to establish the lower logic level.

It is another object of the present invention to provide a circuit device which may be wire-OR'd with other similar circuits or ECL devices.

The aforementioned objects and features of the present invention will become more apparent when taken in conjunction with the following description and drawing wherein like characters indicate like parts and which drawing forms a part of the present specification.

BRIEF DESCRIPTION OF THE DRAWING

FIG. 1 is a circuit diagram of the preferred embodiment of the invention.

DESCRIPTION OF THE PREFRRED EMBODIMENT

Referring to FIG. 1, a CMOS logic device 10, connected between a reference potential such as ground at the terminal designated VDD and a first power supply of −3.3 volts designated VSS, provides at its output logic level signals of 0 and 1. These signals are applied to the input of the converter-buffer circuit 20 which input is labeled VA. The circuit 20 has an output terminal labeled V0 and a first and second power supply terminal labeled VSS and VSP, respectively. The voltage applied to the VSS terminal is −3.3 volts and the voltage applied to the terminal VSP is −0.8 volts. These voltages are set forth in Table 2. The output terminal V0 is coupled to a transmission line 25 which is directed to an input of an ECL logic device 30. At the end of the transmission line a termination resistor RT is connected to a termination power supply terminal labeled VTT. In the preferred embodiment, the value of the power supply voltage is −2.0 volts.

The converter-buffer circuit 20 is shown additionally comprised of three transistors TR1, TR2 and TR3. Transistor TR1 is an N channel transistor having its gate electrode connected to the input terminal VA, its source electrode connected to the power terminal VSS and its drain terminal connected to the gate of the transistor TR2. Transistors TR3 and TR2 are P channel transistors. The source electrode of transistor TR2 is connected to the power terminal VSP and its drain electrode is connected to the output terminal V0. The transistor TR3 has its gate input connected to the input terminal VA, its drain electrode connected to the output terminal V0 and its source electrode connected to the gate electrode of transistor TR2. The voltage levels at the input terminal, output terminal and the gate of transistor TR2 are labeled VA, V0, and VB, respectively. These voltage levels are also shown in Table 1 for the logic level conditions 1 and 0. Referring now to Table 1 in conjunction with the circuit shown in the drawing, the operation of the device is such that when a logic 1 signal "ground voltage" is applied to the VA input terminal, transistor TR1 is "ON" and transistor TR3 is "OFF" and transistor TR2 is "ON" such that the voltage at terminal VSP is transmitted to the output terminal (V0). As the voltage at terminal VA is lowered towards −3.3 volts, transistor TR1 begins to turn "OFF" simultaneously as transistor TR3 turns "ON" which effectively shorts the gate to the drain of transistor TR2 allowing transistor TR2 to remain in the "saturation region" without turning "OFF". This operation causes the voltage at the output terminal V0 to transfer from a voltage level of (VSP) to a new level of [|VSP|+|VT|] while maintaining a relatively constant impedance. The resulting logic level signal at the output is directly compatible to interface with ECL logic. As can be seen, the function performed by the circuit is that of a voltage follower, however, the output voltage clamps approximately at the levels defined by the network and associated power sources.

The circuit embodiment of the present invention thus provides a novel solution for interfacing CMOS logic level devices to ECL logic level devices while maintaining a relatively constant impedance.

TABLE 1

| | Node Voltage Conditions | | | |
|---|---|---|---|---|
| | $V_A$ | $V_B$ | $V_O$ | Units |
| Logic "1" | 0 | −3.3 | −0.8 | Volts |
| Logic "0" | −3.3 | −1.6 | −1.6 | Volts |

TABLE 2

| Definition of Conditions | |
|---|---|
| $V_{SP}$ = TR2 Source Power Supply | −0.8 Volts |
| $V_{DD}$ = Circuit Ground | |
| $V_{SS}$ = Circuit Main Power Supply | −3.3 Volts |
| $V_{TT}$ = Termination Power Supply | −2.0 Volts |
| $V_T$ = Device Threshold Voltage of TR2 | −0.8 Volts |

While there has been shown what is considered to be the preferred embodiment of the invention, it will be manifest that many changes and modifications may be made therein without departing from the essential spirit of the invention. It is intended, therefore, in the annexed claims, to cover all such changes and modifications as fall within the true scope of the invention.

We claim:

1. A converter-buffer for converting a first set of logic level signals to a second set of logic level signals comprising:
    an input terminal connectable to a source of said first set of logic level signals;
    an output terminal connectable to a device responsive to said second set of logic level signals;
    first and second power terminals for connection to first and second power supplies, respectively;
    a transistor of first conductivity type having first, second and gate terminals, said gate terminal connected to said input terminal, said first terminal connected to said first power terminal;
    a second transistor of opposite conductivity type having first, second and gate terminals, the gate terminal of said second transistor connected to the second terminal of said first transistor, the second terminal of said second transistor connected to said output terminal, and the first terminal of said second transistor connected to said second power supply terminal; and
    saturation means connected between the gate terminal and the second terminal of said second transistor, said saturation means responsive to the signal on said input terminal for saturating said second transistor in an "ON" state.

2. A converter-buffer for converting a first set of logic level signals to a second set of logic level signals comprising:
    an input terminal connectable to a source of said first set of logic level signals;
    an output terminal connectable to a device responsive to said second set of logic level signals;
    first and second power terminals for connection to first and second power suplies, respectively;
    a first transistor of first conductivity type having first, second and gate terminals, said gate terminal connected to said input terminal, said first terminal connected to said first power terminal; and
    second and third transistors of opposite conductivity type having first, second and gate terminals, the gate terminal of said third transistor connected to said input terminal, the first terminal of said third transistor connected to the gate of said second transistor and to the second terminal of said first transistor, the second terminal of said second and said third transistors connected to said output terminal, the first terminal of said second transistor connected to said second power terminal.

3. A converter-buffer for converting CMOS logic level signals to ECL logic level signals comprising:
    an input terminal and an output terminal, said input terminal connectable to a source of CMOS logic level signals, said output terminal connectable to an ECL device;
    a first terminal for connection to a first power supply;
    a second terminal for connection to a second power supply;
    an N channel transistor having source, drain, and gate electrodes, said gate electrode connected to said input terminal, said source electrode connected to said first terminal; and
    second and third P channel transistors each having source, drain, and gate electrodes, the gate electrode of said third transistor connected to said input terminal, the source of said third transistor connected to the gate of said second transistor and to the drain of said first transistor; the drain of said second and said third transistors connected to said output terminal, the source electrode of said second transistor connected to said second terminal.

* * * * *